(12) United States Patent
Hirao et al.

(10) Patent No.: US 6,577,591 B2
(45) Date of Patent: Jun. 10, 2003

(54) OPTICAL RECORDING MEDIUM

(75) Inventors: Akiko Hirao, Minatu-ku (JP); Hideyuki Nishizawa, Minatu-ku (JP); Kazuki Matsumoto, Minatu-ku (JP); Takayuki Tsukamoto, Minatu-ku (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 255 days.

(21) Appl. No.: 09/805,128

(22) Filed: Mar. 14, 2001

(65) Prior Publication Data

US 2001/0030935 A1 Oct. 18, 2001

(30) Foreign Application Priority Data

Mar. 31, 2000 (JP) .................................. 2000-098028

(51) Int. Cl.[7] .................................................. G11B 5/84
(52) U.S. Cl. ............................ 369/276; 369/126; 430/1; 430/290; 359/3
(58) Field of Search ............................. 369/276, 126, 369/103, 275.1, 275.2, 121, 94; 430/1, 2; 359/3, 6; 365/124

(56) References Cited

U.S. PATENT DOCUMENTS

| | | | | |
|---|---|---|---|---|
| 4,340,953 A | * | 7/1982 | Iwamura et al. | ............. 369/276 |
| 4,886,339 A | * | 12/1989 | Scozzafava et al. | ......... 385/141 |
| 4,999,809 A | * | 3/1991 | Schildkraut et al. | ........ 365/106 |
| 5,064,264 A | | 11/1991 | Ducharme et al. | |
| 5,115,336 A | * | 5/1992 | Schildkraut et al. | ........ 359/263 |
| 5,543,251 A | * | 8/1996 | Taylor | ............................ 430/1 |
| 5,569,565 A | * | 10/1996 | Kawakami et al. | ............. 430/1 |
| 5,744,267 A | * | 4/1998 | Meerholz et al. | ............... 430/1 |
| 5,800,950 A | | 9/1998 | Hirao et al. | |

FOREIGN PATENT DOCUMENTS

| | | | | |
|---|---|---|---|---|
| JP | 58-147826 A | * | 9/1983 | .................. 369/276 |
| JP | 58-147828 A | * | 9/1983 | .................. 369/276 |

* cited by examiner

*Primary Examiner*—Tan Dinh
(74) *Attorney, Agent, or Firm*—Oblon, Spivak, McClelland, Maier & Neustadt, P.C.

(57) ABSTRACT

Disclosed is an optical recording medium having a charge generating ability capable of generating electric charges with different polarities upon irradiation with light and a charge transporting ability capable of transporting at least one of the electric charges to separate specially the electric charges from each other forming an electric field upon irradiation with light, the optical characteristics of the optical recording medium being changed depending on the electric field, wherein the charge transporting capability is imparted by a charge transporting material formed of a molecule having a charge transporting capability or a polymer containing a monomer unit having a charge transporting capability. A light intensity pattern is recorded in the optical recording medium depending on the change in the optical characteristics caused by the electric field. The average intermolecular distance of a noticed charge transporting material is defined to fall within a predetermined range.

20 Claims, 3 Drawing Sheets

OPTICAL RECORDING MEDIUM

CROSS-REFERENCE TO RELATED APPLICATIONS

This application is based upon and claims the benefit of priority from the prior Japanese Patent Application No. 2000-098028, filed Mar. 31, 2000, the entire contents of which are incorporated herein by reference.

BACKGROUND OF THE INVENTION

The present invention relates to an optical recording medium.

A photorefractive medium is known to the art as one of optical recording media capable of achieving a recording density markedly higher than that of the conventional optical heat phase change type media such as a photomagnetic recording disc or an optical disc. The optorefractive medium, in which data having a large capacity such as a high density image can be recorded, is a medium in which the refractive index of the recording layer is changed by the following mechanism. Specifically, upon irradiation with light, an electric charge is generated within the photorefractive material and the electric charge thus generated is separated in space. The refractive index of the material is changed by the electric field derived from the electric charge distribution. If the electric field generated within the medium is increased, it is possible to obtain a greater change in the refractive index because of the Pockels effect. The photorefractive medium of this type is capable of recording the interference pattern of light directly as a lattice of the refractive index and, thus, is expected to be applied to a holographic memory and to an optical pattern recognition, and holographic associative memories.

In recent years, the photorefractive medium using an organic material is being developed vigorously because the medium can be manufactured easily, as disclosed in, for example, Japanese Patent Publication (Kokoku) No. 6-55901. The photorefractive material using an organic material has a dielectric constant incommensurably smaller than that of an inorganic ferroelectric crystal and is expected to achieve a large performance index and a high response capability. However, in utilizing the particular photorefractive material, it was necessary to mount an electrode for applying a very high electric field from the outside, as disclosed in, for example, Japanese Patent Disclosure (Kokai) No. 6-175167. This is due to the circumstances described below.

Specifically, if the photorefractive medium is irradiated with the interference pattern of light, the carriers the number of which corresponds to the intensity of the light is generated in the photorefractive medium. If an external electric field $E_{ex}$ is applied to the photorefractive medium such that the field $E_{ex}$ is parallel to the light irradiated plane, the electric field E generated at this time is represented by formula (9) given below:

$$E=E_0[(1+iE_{ex}/E_d)/\{1+iE_{ex}/(E_d+E_q)\}](I_1/I_0) \quad (9)$$

$$E_0=iE_d/(1+E_d/E_q) \quad (10)$$

$$E_d=(2\pi D)/(\mu\Lambda) \quad (11)$$

$$E_q=(eN\Lambda)/(2\pi\epsilon) \quad (12)$$

where $I_0$ represents a space average of the intensity of the irradiating light, $I_1$ represents the difference between the maximal value and the minimal value of the intensity of the irradiating light, $\Lambda$ represents a spatial period at which the light intensity assumes the maximal value, $\epsilon$ represents the dielectric constant of the photorefractive medium, N represents the concentration of the space charge, D represents the diffusion coefficient, $\mu$ represents the mobility, e represents the elementary charge, and i represents the imaginary unit.

Formulas (9) to (12) given above denote that the phase of the interference pattern of light is deviated from the phase of the electric field E, as described in, for example, "Pochi Yeh, Introduction to Photorefractive Nonlinear Optics, John Wiley & Sons, Inc., 1993, Chapter 3".

In physics, $E_d$ represents the electric field produced by the charge diffusion, and $E_q$ represents the space electric field produced by the ionized impurity and the immovable charge. In general, the Einstein's relation $D/\mu=kT/e$, where k represents the Boltzmann constant and T represents the absolute temperature, is considered to be established between the diffusion coefficient D and the mobility $\mu$ and, thus, $E_d$ is a constant that is not dependent on a substance. Therefore, in order to obtain a large electric field E, it was necessary for $E_q$ to be sufficiently larger than $E_d$ and it was also necessary to increase $E_{ex}$.

For making $E_q$ larger than $E_d$, it is necessary to increase the value of $\Lambda$ or N in formula (12) given above. However, if the value of $\Lambda$ is increased, the number of sets of the interference patterns recorded in the thickness direction of the film is diminished so as to lower the recording density. On the other hand, where the concentration N of the space charge is increased, a difficulty is generated that the mobility is lowered by the migrating of the charge.

Since the time required for forming the electric field is determined by the drift velocity of the charge, the drop of the mobility implies the drop in the writing rate. It follows that it is necessary to avoid the drop of the mobility as much as possible.

In the substance in which the relationship between the mobility and the diffusion coefficient follows the Einstein's relation, the ratio of the diffusion coefficient to the mobility ($D/\mu$) is very small. For example, in the case of the irradiation of the light intensity pattern of $\Lambda=1$ $\mu$m under room temperature 300K, the electric field $E_d$ due to the diffusion is 0.16 MV/m, which is not sufficiently high. Therefore, where such a substance is used as the photorefractive medium, an electric field not lower than 10 MV/m was applied from the outside, as described in, for example, "W. E. Moerner, and Scott M. Silence, Chem. Rev. 94, pp127–155 (1994)). In a substance having at least 5, preferably at least 10, of the ratio $D/\mu$, it is possible to record the light intensity pattern by generating an internal electric field of this level by extremely diminishing the electric field applied from the outside or, in some cases, without applying the electric field from the outside. Such being the situation, it is of high importance to develop measures for increasing the ratio $D/\mu$.

In the conventional photorefractive medium, however, the ratio $D/\mu$ is not sufficiently large, making it impossible to form the space electric field without applying a very high electric field.

BRIEF SUMMARY OF THE INVENTION

An object of the present invention is to provide an optical recording medium capable of recording information with a high recording density by the light irradiation even under the condition that the applied electric field.

According to a first aspect of the present invention, there is provided an optical recording medium having a charge generating ability capable of generating electric charges with different polarities upon irradiation with light and a charge transporting ability capable of transporting at least one of the electric charges to separate specially the electric charges from each other forming an electric field upon irradiation with light, the optical characteristics of the optical recording medium being changed depending on the electric field and the capability of transporting at least one of the electric charges being imparted by a single kind of a charge transporting material, wherein a light intensity pattern is recorded in the optical recording medium depending on the change in the optical characteristics caused by the electric field, and the electric field is generated by spatially separating the electric charges of the different polarity by light irradiation, the charge transporting material is formed of a molecule having the charge transporting capability or a polymer containing a monomer unit having the charge transporting capability, and the charge transporting material has an average intermolecular distance a (nm) and a dipole moment p1 (debye) satisfying at room temperature the relationships represented by formulas (1) to (3) given below:

$$a<2.0 \tag{1}$$

$$1.0<p1 \tag{2}$$

$$a_{max}-0.1<a<a_{max}+0.3 \tag{3}$$

where a is calculated from the formula: $a=(M/AC\ \rho_a)^{1/3}$, where M is the molecular weight of the charge transporting material, A is the Avogadro's number, C is the weight ratio of the charge transporting material in the optical recording medium, and $\rho_a$ is the specific gravity of the optical recording medium; and where $a_{max}$ is the value of the intermolecular distance a when the value represented by formula (4) given below is a maximal value:

$$\frac{(a-0.12)^2}{a^6}\exp\left[-\frac{0.087p_1^2}{\varepsilon_r^2 a^2 b^2} - \frac{1}{(a-0.12)^2}\right] \tag{4}$$

where $\epsilon_r$ is the relative dielectric constant of the optical recording medium, and b is a value determined as follows in accordance with the relationship between $a_v$ and a:

$$\text{when } 0.54a \geq a_v, b=0.54a \tag{5}$$

$$\text{when } 0.54a < a_v, b=a_v \tag{6}$$

where $a_v$ is the length of one side when the charge transporting material is regarded as a cube, and is represented by the formula: $a_v=(M/A\rho_m)^{1/3}$, where M is the molecular weight of the charge transporting material, A is the Avogadro's number, and $\rho_m$ is the specific gravity of the charge transporting material.

According to a second aspect of the present invention, there is provided an optical recording medium having a charge generating ability capable of generating electric charges with different polarities upon irradiation with light and a charge transporting ability capable of transporting at least one of the electric charges to separate specially the electric charges from each other forming an electric field upon irradiation with light, the optical characteristics of the optical recording medium being changed depending on the electric field and the capability of transporting at least one of the electric charges being imparted by a first charge transporting material and a second charge transporting material, wherein a light intensity pattern is recorded in the optical recording medium depending on the change in the optical characteristics caused by the electric field, and the electric field is generated by spatially separating the electric charges of the different polarity by light irradiation, the first charge transporting material has a content higher than that of the second charge transporting material, and each of the first and second charge transporting materials is formed of a molecule having the charge transporting capability or a polymer containing a monomer unit having the charge transporting capability, and the first charge transporting material has an average intermolecular distance a (nm) and a dipole moment p1 (debye) satisfying at room temperature the relationships represented by formulas (1) to (3) given below:

$$a<2.0 \tag{1}$$

$$1.0<p1 \tag{2}$$

$$a_{max}-0.1<a<a_{max}+0.3 \tag{3}$$

where a is calculated from the formula: $a=(M/AC\ \rho_a)^{1/3}$, where M is the molecular weight of the first charge transporting material, A is the Avogadro's number, C is the weight ratio of the first charge transporting material in the optical recording medium, and $\rho_a$ is the specific gravity of the optical recording medium; and where $a_{max}$ is the value of the intermolecular distance a when the value represented by formula (7) given below is a maximal value:

$$\frac{(a-0.12)^2}{a^6}\exp\left[-\frac{0.087p_1^2}{\varepsilon_r^2 a^2 b^2} - \frac{0.087p_2^2}{\varepsilon_r^2 d^4} - \frac{1}{(a-0.12)^2}\right] \tag{7}$$

where $\epsilon_r$ is the relative dielectric constant of the optical recording medium, d (nm) is an average intermolecular distance of the second charge transporting material, p2 (debye) is the dipole moment of the second charge transporting material, and b is a value determined as follows in accordance with the relationship between $a_v$ and a:

$$\text{when } 0.54a \geq a_v, b=0.54a \tag{5}$$

$$\text{when } 0.54a < a_v, b=a_v \tag{6}$$

where $a_v$ is the length of one side when the first charge transporting material is regarded as a cube, and is represented by the formula: $a_v=(M/A\rho_m)^{1/3}$, where M is the molecular weight of the first charge transporting material, A is the Avogadro's number, and $\rho_m$ is the specific gravity of the first charge transporting material.

According to a third aspect of the present invention, there is provided an optical recording medium having a charge generating ability capable of generating electric charges with different polarities upon irradiation with light and a charge transporting ability capable of transporting at least one of the electric charges to separate specially the electric charges from each other forming an electric field upon irradiation with light, the optical characteristics of the optical recording medium being changed depending on the electric field and the capability of transporting at least one of the electric charges being imparted by at least three kinds of charge transporting materials, wherein a light intensity pattern is recorded in the optical recording medium depending on the change in the optical characteristics caused by the electric field, and the electric field is generated by spatially separating the electric charges of the different polarity by light irradiation, each of the charge transporting materials is formed of a molecule having the charge transporting capability or a polymer containing a monomer unit having the charge transporting capability, and the charge transporting material having the highest content has an average intermolecular distance a (nm) and a dipole moment p1 (debye) satisfying at room temperature the relationships represented by formulas (1) to (3) given below:

$$a<2.0 \tag{1}$$

$$1.0<p1 \tag{2}$$

$$a_{max}-0.1<a<a_{max}+0.3 \tag{3}$$

where a is calculated from the formula: $a=(M/AC\rho_a)^{1/3}$, where M is the molecular weight of the charge transporting material having the maximum content, A is the Avogadro's number, C is the weight ratio of the charge transporting material having the highest content in the optical recording medium, and $\rho_a$ is the specific gravity of the optical recording medium; and where $a_{max}$ is the value of the intermolecular distance a when the value represented by formula (8) given below is a maximal value:

$$\frac{(a-0.12)^2}{a^6}\exp\left[-\frac{0.087P_1^2}{\varepsilon_r^2 a^2 b^2}-\sum_{n=2}^{m}\frac{0.087P_n^2}{\varepsilon_r^2 l_n^4}-\frac{1}{(a-0.12)^2}\right] \tag{8}$$

where $\varepsilon_r$ is the relative dielectric constant of the optical recording medium, $l_n$ is an average intermolecular distance (nm) of the n-th kind of the charge transporting material, $p_n$ is the dipole moment (debye) of the n-th kind the charge transporting material, n is an integer of 2 to m, m is an integer of 3 or more, and b is a value determined as follows in accordance with the relationship between $a_v$ and a:

$$\text{when } 0.54a \geq a_v,\ b=0.54a \tag{5}$$

$$\text{when } 0.54a < a_v,\ b=a_v \tag{6}$$

where $a_v$ is the length of one side when the charge transporting material having the highest content is regarded as a cube, and is represented by the formula: $a_v=(M/A\rho_m)^{1/3}$, where M is the molecular weight of the charge transporting material, A is the Avogadro's number, and $\rho_m$ is the specific gravity of the charge transporting material having the highest content.

According to a fourth aspect of the present invention, there is provided an optical recording medium having a charge generating ability capable of generating electric charges with different polarities upon irradiation with light and a charge transporting ability capable of transporting at least one of the electric charges to separate specially the electric charges from each other forming an electric field upon irradiation with light, the optical characteristics of the optical recording medium being changed depending on the electric field and the capability of transporting at least one of the electric charges being imparted by at least one kind of charge transporting materials, wherein a light intensity pattern is recorded in the optical recording medium depending on the change in the optical characteristics caused by the electric field, and the electric field is generated by spatially separating the electric charges of the different polarity by light irradiation, each of the charge transporting materials is formed of a molecule having the charge transporting capability or a polymer containing a monomer unit having the charge transporting capability, and the optical recording medium satisfies the relationships represented by formulas (1) to (3) given below:

$$a<2.0 \tag{1}$$

$$1.0<p1 \tag{2}$$

$$a_{max}-0.1<a<a_{max}+0.3 \tag{3}$$

where a is an average intermolecular distance (nm) of a main charge transporting material of the charge transporting materials, p1 is the dipole moment (debye) of the main charge transporting material, and $a_{max}$ is the value of the intermolecular distance a when the value represented by formula (15) given below is a maximal value:

$$c(a-0.12)^2\left(\frac{7.529\times10^{11}}{\varepsilon_r^2}\sum_n\frac{P_n^2}{a^3 b_n^3 \gamma-2}\right)\times \tag{15}$$
$$\exp\left\{-\frac{1}{(a-0.12)^2}\right\}\exp\left(-\frac{3\times0.0037647}{5kT\varepsilon_r^2}\sum_n\frac{P_n^2}{a^2 b_n^2 \gamma-4/3}\right)$$

where $\varepsilon_r$ is the relative dielectric constant of the optical recording medium, k is the Boltzmann constant, T is the temperature (K), $P_n$ is the dipole moment of a noticed molecule, $\gamma$ is the number of the noticed molecule present in a unit cube in which the single main charge transporting molecule is present, C is a constant, and $b_n$ is a value determined as follows in accordance with the relationship between $a_v$ and $a/((\gamma)^{1/3})$:

$$\text{when } 0.54a/\sqrt[3]{\gamma} \geq a_v,\ b_n=0.54a$$

$$\text{when } 0.54a/\sqrt[3]{\gamma} < a_v,\ b_n=a_v$$

where $a_v$ is the length of one side when the noticed molecule is regarded as a cube, and $a/((\gamma)^{1/3})$ is an average molecular distance of the noticed molecule.

In this fourth aspect, the main charge transporting material is that having highest content in the optical recording medium. Further, the each noticed molecule is the molecule having the charge transporting capability or the polymer containing the monomer unit having the charge transporting capability. In the above formula (15), n of $P_n$, $b_n$ denotes the kind of the molecule or polymer described herein.

According to a fifth aspect of the present invention, there is provided an optical recording-reproducing apparatus in which information is recorded in and reproduced from the optical recording medium noted above, comprising:

recording means for collecting a recording light so as to form a mark in the optical recording medium; and reproducing means for reproducing the recorded information by utilizing the phenomenon that the reflectance or transmittance of light is changed depending on the presence or absence of the mark when the optical recording means is irradiated with the reproducing light.

Further, according to a sixth aspect of the present invention, there is provided an optical recording medium in which information is recorded in and reproduced from the optical recording medium, comprising:

recording means for recording information by irradiating the optical recording medium with a recording light having two dimensionally processed information added thereto together with a reference light; and reproducing means for reproducing the recorded information by detecting with a two dimensional detector the emitted light when the optical recording medium is irradiated with only the reproduced light.

DETAILED DESCRIPTION OF THE INVENTION

The present invention will now be described in detail.

The present inventors have obtained a method that permits simultaneously measuring the mobility and the diffusion coefficient by analyzing the transient light current (Hirao, Nishizawa, Sugiuchi, Physical Review Letters. Vol. 75, No. 9, pp. 1787–1790 (1995)). Specifically, a sample in the form of a film is sandwiched between two electrodes, and one electrode is irradiated with a pulse light that is absorbed in the surface of the sample. It is possible to obtain simultaneously the diffusion coefficient D and the mobility μ by measuring the transient current flowing into the external circuit and by fitting the formula of the current that is theoretically obtained to the wave form of the current thus obtained.

The present inventors have measured by using the particular method the transport coefficient of an optical recording medium having an electrical charge generating capability, an electrical charge transporting capability, and the capability of changing the optical characteristics depending on the electric field so as to arrive at the present invention. In the optical recording medium of the present invention, the electrical charge transporting capability is imparted by a charge transporting material, and the charge transporting material is formed of a molecule having a charge transporting capability or a polymer containing a monomer unit having a charge transporting capability.

The internal electric field formed within a photorefractive medium is considered to be proportional to a ratio D/μ, i.e., a ratio of the diffusion coefficient D to the drift mobility μ. Therefore, a high internal electric field can be formed by finding the condition under which the ratio D/μ is increased.

The ratio D/μ was considered in the past to be represented by formula (13) given below:

$$\frac{D}{\mu} = \beta_1 \frac{4.73 \times 10^{12} P_1^2}{\varepsilon_r^2 a^6} \exp\left(-\frac{3 \times 0.00694 P_1^2}{5kT\varepsilon_r^2 a^4}\right) \quad (13)$$

where $\beta_1$ is a constant, a is the distance (nm) between adjacent charge transporting molecules, k is the Boltzmann constant, $P_1$ is the dipole moment of the molecule; $\varepsilon_r$ is the relative dielectric constant of the optical recording medium, and T is the temperature (K).

Figure 1:
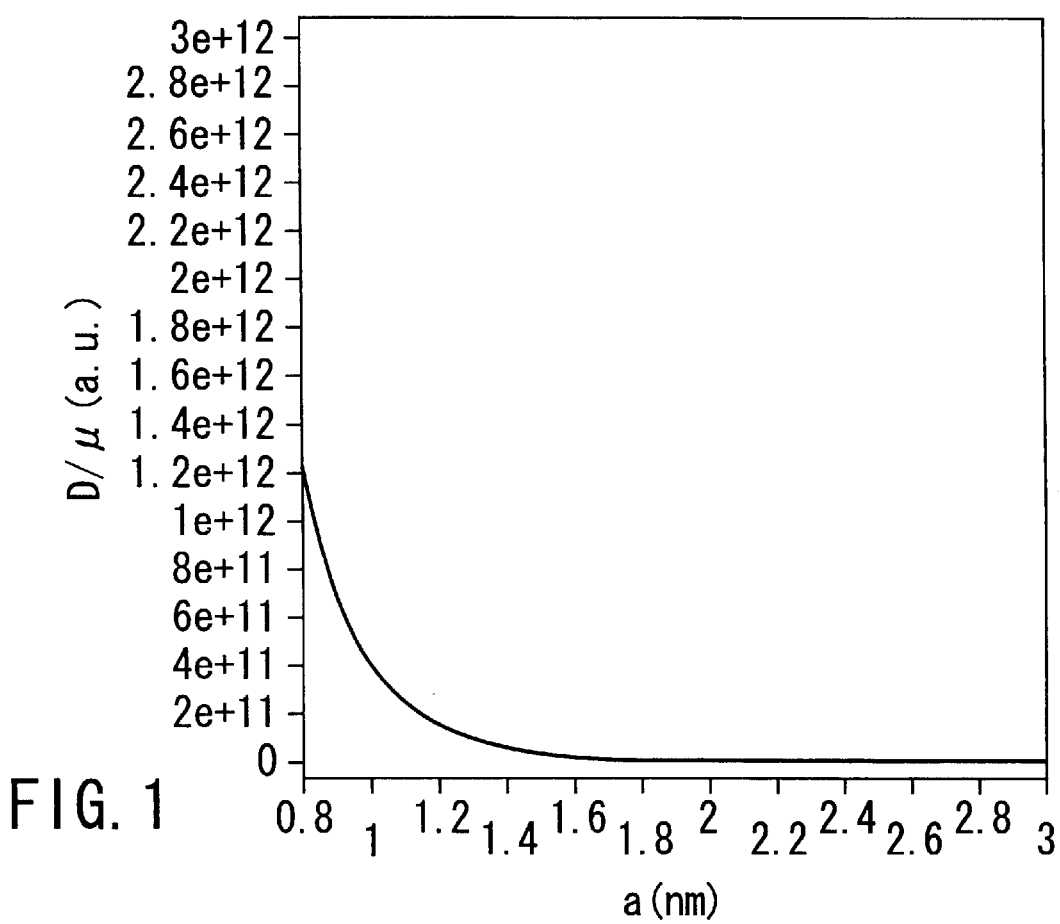
FIG. 1 is a figure showing the relationship between the intermolecular distance a (nm) and the ratio D/μ in accordance with the conventional relationship.

The ratio D/μ was obtained by substituting each parameter in formula (13) in respect of a certain optical recording medium, and the result was plotted relative to the distance a (nm) between adjacent charge transporting molecules so as to obtain the relationship shown in FIG. 1. Since the molecule is sized at about 0.9 nm in this system, an average intermolecular distance, which is the distance between the centers of the adjacent charge transporting molecules, is larger than at least 0.9 nm. Within this range, the ratio D/μ is monotonously decreased with increase in the average intermolecular distance a (nm), as apparent from FIG. 1. Therefore, the ratio D/μ was considered in the past to be increased with decrease in the intermolecular distance a (nm).

Figure 2:
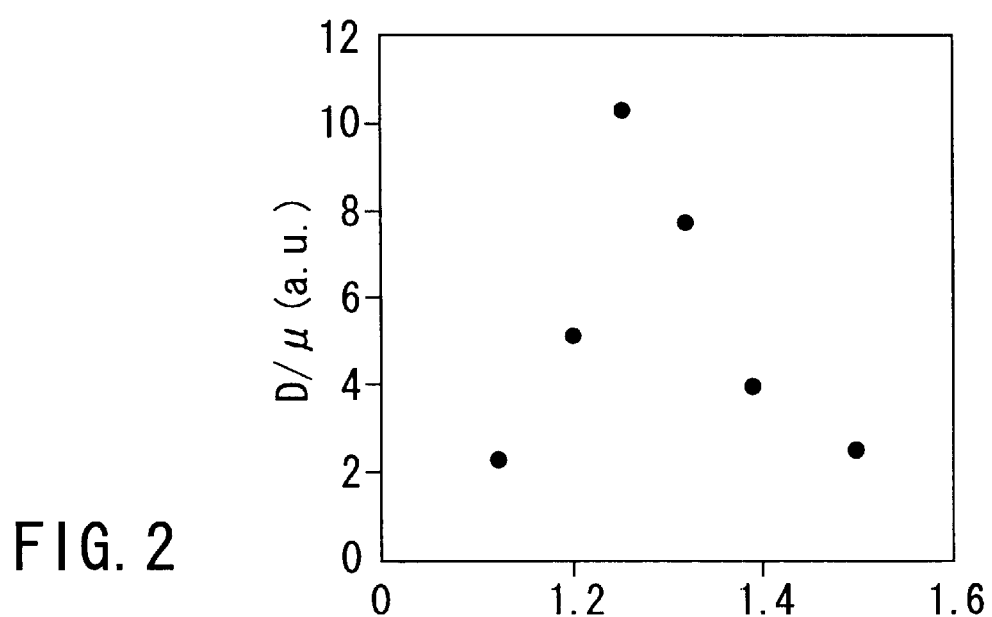
FIG. 2 is a figure showing the relationship between the intermolecular distance a (nm) and the ratio D/μ based on the actually measured values.

However, the present inventors have actually measured the relationship between the intermolecular distance a (nm) of the charge transporting materials and the ratio D/μ, finding that the ratio D/μ has a maximal value relative to the intermolecular distance a (nm), as shown in FIG. 2. The experimental data was examined in detail, finding that the ratio D/μ should correctly be represented by formula (14) given below, rather than formula (13) given above:

$$\frac{D}{\mu} = \beta_2 \frac{(a-0.12)^2}{a^6} \times \quad (14)$$

$$\exp\left[-\frac{0.0023P_1^2}{kT\varepsilon_r^2 a^2 b^2} - \sum_{n=2}^{m} \frac{0.0023P_n^2}{kT\varepsilon_r^2 l_n^4 \gamma - 4/3} - \frac{1}{(a-0.12)^2}\right]$$

Incidentally, m-kinds of charge transporting materials are contained in the medium, and each charge transporting material is formed of a molecule having a charge transporting capability or a polymer containing a monomer unit having a charge transporting capability. Attentions are paid to the charge transporting material contained in the largest amount in the medium.

The letter "a" in formula (14), which represents an average distance (nm) between the adjacent charge transporting materials contained in the largest amount in the optical recording medium, is calculated by the formula: $a=(M_m/AC\rho_a)^{1/3} \times 10^7$ (nm), where M is the molecular weight of the charge transporting material contained in the largest amount in the optical recording medium, A is the Avogadro's number, C is the weight ratio of the charge transporting materials contained in the largest amount in the optical recording medium, and $\rho_a$ is the specific gravity of the optical recording medium.

In formula (14), $P_1$ is the dipole moment (debye) of the charge transporting material contained in the largest amount in the optical recording medium, $\beta_2$ is a constant, $\varepsilon_r$ is the relative dielectric constant of the optical recording medium, T is the temperature, $l_n$ is the average distance (nm) between adjacent n-th kind of charge transporting materials, $P_n$ is the dipole moment of the n-th kind of the charge transporting material, γ is the number of n-th kind of charge transporting materials present in a cube having a side a, n is an integer of 2 to m, and m is an integer of 3 or more, and b is a value determined as follows in accordance with the relationship between $a_v$ and a:

when $0.54a \geq a_v$, $b=0.54a$      (5)

when $0.54a < a_v$, $b=a_v$      (6)

where $a_v$ is the length of one side when the charge transporting material is regarded as a cube, and is represented by the formula: $a_v=(M/A\rho_m)^{1/3}$, where M is the molecular weight of the charge transporting material, A is the Avogadro's number, and $\rho_m$ is the specific gravity of the charge transporting material.

The origin of the numeral "0.54" included in formulas (5) and (6) given above will now be described. Specifically, in achieving the present invention, the present inventors considered that the distance between the two adjacent charge transporting molecules positioned closest to each other among all the charge transporting molecules would be larger than the most frequent and closest intermolecular distance and larger than the diameter of the molecule, and have succeeded in demonstrating their idea. The numeral "0.54" noted above represents the most frequent and closest intermolecular distance standardized by the intermolecular distance in the case where the charge transporting molecules are equidistantly arranged. This value, which represents the distance that permits the radial distribution function to have the largest value in the case of the random distribution, is ½π to 0.54. This is described in detail in "D. J. Dunstan, Philos. Mag. B46,579(1982)".

The dipole moment of the charge transporting material used here is obtained by the method described in "M. Sugiuchi and H. Nishizawa, J. Imag. Sci. Technol. 37, 245 (1993)".

The relative dielectric constant of a medium represents a static dielectric constant at room temperature of 20° C. and can be measured by a bridge method or a resonance method that is widely used. The method using a Q meter is most widely employed for measuring the relative dielectric constant of a medium. Specifically, a capacitor is prepared by sandwiching a medium formed in a uniform thickness between a pair of electrodes. The relative dielectric constant can be measured by measuring the amount of charge flowing into the electrodes when voltage is applied between the two electrodes.

Figure 3:
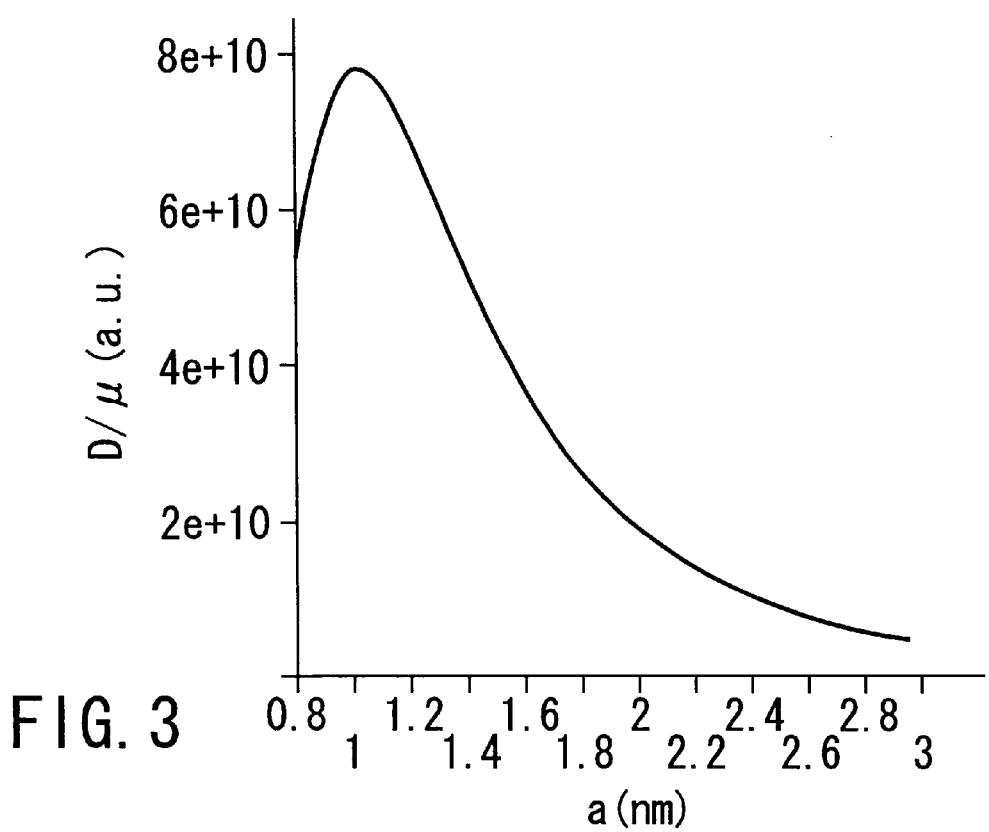
FIG. 3 is a figure showing the relationship between the intermolecular distance a (nm) and the ratio D/μ in accordance with the present invention.

The ratio $D/\mu$ was obtained by substituting the parameter in formula (14), and the values of $D/\mu$ thus obtained were plotted relative to the intermolecular distance so as to obtain FIG. 3. As apparent from FIG. 3, the ratio $D/\mu$ exhibits a maximal value at a certain intermolecular distance. The present inventors have found that the average distance a at which formula (14) gives a maximal value is substantially equal to the average distance a at which each of formulas (4), (7) and (8) gives a maximal value. In other words, in any of the cases where a single kind, two kinds and three or more kinds of charge transporting materials are contained in the optical recording medium, the same situation takes place in respect of the noticed charge transporting material. The noticed molecule is defined in the present invention as follows. Specifically, where, for example, two kinds of charge transporting materials are contained in the optical recording medium, attentions are paid to the charge transporting material that is contained in a larger amount in the optical recording medium or that has a higher drift mobility. The particular charge transporting material, to which attentions are paid, is called herein the noticed charge transporting material. Where three or more kinds of charge transporting materials are contained in the optical recording medium, attentions are paid to the charge transporting material contained in the optical recording medium in the largest amount.

Where the average distance a of the noticed charge transporting material is excessively large, the transporting integration is diminished, with the result that the probability of migration of the charge between the charge transporting materials is lowered so as to cause the charge to substantially cease to be transported. Also, where the permanent dipole moment p1 is excessively small, the energy swing and the potential swing within the optical recording medium is diminished, with the result that the carrier diffusion is unlikely to take place. Such being the situation, the average distance a of the noticed particular charge transporting material and the permanent dipole moment p1 are defined to fall within the ranges represented by formulas (1) to (3) given previously. Incidentally, since the parameters included in the formulas can be measured easily at room temperature, the average distance a, the permanent dipole moment p1, etc. are defined to be those at room temperature in the present invention. Room temperature means a temperature of 20 to 27° C. All parameters used in the present invention are values at this room temperature.

Since the electric field $E_d$ caused by the carrier diffusion is increased with increase in the ratio $D/\mu$, it is unnecessary to increase the electric field applied from the outside to the optical recording medium. In general, the Einstein's relation $D/\mu=kT/e$, where k is the Boltzmann constant and T is the absolute temperature, is established, the ratio $D/\mu$ is a constant that is not dependent on the material. In the present invention, however, utilized is a charge transporting material that is in an amorphous state, not in a most stable crystal state. In addition, the overlapping of the wave function between the charge transporting materials is small, and the probability of the energy exchange between two molecules is low. It follows that, in the present invention, the charge is not necessarily migrated into a stable molecule, resulting in failure to form a "state of thermal equilibrium" that provides a condition for establishing the Einstein's relation, as described in, for example, "R. Richert, L. Pautmeier, and H. Bassler, Phys. Rev. Lett. 63, 547 (1989)". As a result, the ratio $D/\mu$ becomes dependent not only on the temperature but also on the material.

The possibility that the ratio $D/\mu$ does not conform with the Einstein's relation was simply suggested by the simulation relating to the charge transport and is not demonstrated by the measuring (P. M. Borsenberger, E. H. Magin, M. van der Auweraer, and F. C. de Schryver, Phys. Status Solidi (a), 140, 9 (1993)). However, the present inventors have developed the measuring method and confirmed the possibility noted above by the measuring. Specifically, the present inventors have prepared an optical recording medium in which the average distance a between adjacent charge transporting materials is close to the maximal value of each of formulas (4), (7) and (8), and measured the charge transport coefficient so as to obtain a large $D/\mu$ ratio. As a result, the present inventors have made it possible to increase the electric field $E_d$ owing to the carrier diffusion so as to diminish the electric field applied from the outside. In this fashion, the present inventors have found for the first time that it is possible to obtain an optical recording medium in which a large $D/\mu$ ratio is formed by defining the average distance a of the charge transporting material to fall within the range described previously.

As described above, the present inventors have found that, as an optical recording medium, it is possible to increase the ratio $D/\mu$, i.e., the ratio of the diffusion coefficient D representing the charge transporting characteristics to the mobility $\mu$, and to form at a high speed a high internal electric field by the interference pattern irradiation. As a result, it is possible to the information without applying the external electric field to an optical recording medium. In some cases, only the small external electric field is applied in recording.

Within the photorefractive medium, the carrier generated by the light irradiation hops among the charge transporting materials so as to be transported. The transport consists of the drift and the diffusion in the direction of the electric field and can be depicted by the diffusion coefficient D and the drift mobility $\mu$, respectively. If the ratio $D/\mu$ is large, an internal electric field can be formed without applying an external electric field.

In the optical recording medium of the present invention, the charge generation capability can be imparted by mixing a charge transporting material. An optional material that generates an electric charge upon absorption of a writing light can be used as the charge generating material. Specifically, the charge generating material used in the present invention includes, for example, inorganic photoconductors such as selenium, a selenium alloy, CdS, CdSe, AsSe, ZnO, and $\alpha$-Si; phthalocyanine colorants/pigments such as metal phthalocyanine, non-metal phthalocyanine, and derivatives thereof; naphthalocyanine colorants/pigments; azo-series colorants/pigments such as monoazo, disazo, and trisazo; perylene series dyes and pigments; indigo series dyes and pigments; quinacridone series dyes and pigments; polycyclic quinone series dyes and pigments such as anthraquinone and anthoanthron; cyanine series dyes and pigments; charge transporting complexes consisting of an electron acceptor substance and an electron donor substance such as TTF-TCNQ and PVK-TNF; azulenium salt; and fullerenes represented by $C_{60}$ and $C_{70}$ and their derivatives. Particularly, it is desirable to use the charge transporting complex in the present invention as the charge generating material because the charge transporting complex has a large inclination in the electron distribution before excitation with light and, thus, exhibits a high charge generating efficiency in many cases. The charge transporting complex used in the present invention includes combinations of donors such as tetrathiafulvalen and tetrathio tetracene and acceptors such as chloranil, bromanil, and tetracyanoquinodimethane. These charge generating materials can be used singly or in the form of a mixture of at least two of these compounds.

It is necessary for the charge generating material to generate an electric charge upon absorption of a writing light. Therefore, in the case of using a charge generating material having a very high optical density relative to the writing light, it is possible for the writing light not to reach the charge generating material inside the element. In order to avoid such an inconvenience, it is desirable for the optical density of the charge generating material to fall within a range of between $10^{-6}$ and $10$ $cm^{-1}$ when the charge generating material is incorporated in the element.

The writing light does not reach the inner region in also the case where the addition concentration of the charge generating material is excessively high, making it difficult to achieve writing to reach the inner region. On the other hand, where the addition concentration is excessively low, the density of the generated electric charges is low, resulting in failure to form a desired internal electric field. Such being the situation, it is desirable to control the addition concentration of the charge generating material such that the optical density when the charge generating material is incorporated in the element falls within a range of between $10^{-6}$ $cm^{-1}$ and $10$ $cm^{-1}$.

To be more specific, it is desirable for the addition amount of the charge generating material to fall within a range of between 0.01% by weight and 20.0% by weight based on the entire recording medium. If the addition amount is smaller than 0.01% by weight, the amount of the electric charge generated upon light irradiation per unit volume is small and, thus, it is difficult to generate a sufficiently large amount of the internal electric charges. On the other hand, where the addition amount of the charge generating material exceeds 20.0% by weight, the probability of association the charge generating materials is increased so as to increase the conductivity of the recording medium, with the result that it is difficult to generate the internal electric field.

The charge transporting capability of the optical recording medium of the present invention can be imparted by mixing a charge transporting material. An optional charge transporting material selected from a material in which holes or electrons are transported and a material in which electric charges are transported by, for example, the hopping conduction can be used in the present invention. It is possible for the charge transporting materials to be independent molecules, homopolymers and copolymers. To be more specific, the charge transporting materials used in the present invention include, for example, nitrogen-containing cyclic compounds such as indole, carbazole, oxazole, isoxazole, thiazole, imidazole, pyrazole, oxadiazole, pyrazoline, thiathiazole, and triazole, the derivatives of these nitrogen-containing cyclic compounds and compounds having these nitrogen-containing compounds on the backbone chain or side chain; hydrazone, triphenyl amine, triphenyl methane, butadiene, stilbene, quinone compounds such as anthraquinone diphenoquinone, derivatives thereof, compounds having these compounds on the backbone chain or side chain; fullerenes such as $C_{60}$ and $C_{70}$ and derivatives thereof. It is also possible to use as the charge transporting material $\pi$-conjugated polymers or oligomers such as polyacetylene, polypyrrol, polythiophene, and polyaniline; $\sigma$-conjugated polymers or oligomers such as polysilane and polygermane; and polycyclic aromatic compounds such as anthracene, pyrene, phenanthrene, and coronene.

Where the charge transporting material used in the present invention is formed of a polymer, the polymer is not limited to a homopolymer formed of a single kind of monomer. In the case of using a copolymer formed of a plurality of different kinds of monomers, it is reasonable to understand that a plurality of different kinds of charge transporting materials, the number of kinds being equal to the number of kinds of the monomers, are used in the present invention. For example, in the case of using a copolymer consisting of two different kinds of monomers, in which another charge transporting molecules or polymers are not contained in the medium, the monomer having a higher content is handled as the first charge transporting material. The weight ratio can be converted from the weight ratio of the mixed polymers and from the molar ratio of the two monomers. Further, the distance of the charge transporting material is calculated on the assumption that the charge transporting material is present at random as in the case of the molecules.

The carriers generated from the charge generating material are injected into the charge transporting material and, then, allowed to migrate within the charge transporting material so as to form an electric field.

In the optical recording medium of the present invention, the light intensity pattern is recorded by modulating the optical characteristics such as the refractive index by the internal electric field formed by the light irradiation. Therefore, it is absolutely necessary for the optical recording medium of the present invention to contain a material having the capability of changing the optical characteristics by the electric field. To be more specific, the particular material includes, for example, a material whose absorption coefficient and the reflectance are changed by the Franz-Keldysh effect, a material whose absorption coefficient, the reflectance or the fluorescence efficiency is changed by the exciton effect, a material whose refractive index is changed by the Pockels effect, and a material whose optical characteristics under the excited state are changed and whose life of the excited state is prolonged by the electric field. In the case of utilizing the Pockels effect, which is one of the electrooptical effects, the optical recording medium of the present invention contains a material exhibiting the Pockels effect so as to modulate the refractive index. By performing the poling by applying an electric field to the film, the pattern of the internal electric field is converted into a modulation pattern of the refractive index. A material exhibiting an electrooptical effect is called a nonlinear optical material in some cases. The nonlinear optical material adapted for use in the present invention is called a secondary nonlinear optical material. The secondary nonlinear optical material used in the present invention includes, for example, NPAN, NPP, POM, MAP, DAN, MNA, MBANP, COANP, NMONS, NMBA, DMNPU (Dimethylaminophenylurea), MNS (Methyl-4-nitrophenylsulphide), DBMNA (4-4'-Dimethylaminocyanobiphenyl), DMACB, and LAP (L-Arginino phosphate monohydrate).

It is possible to use fullerenes such as $C_{60}$ and $C_{70}$ as the nonlinear optical material. Alternatively, it is also possible to allow the charge generating material, the charge transporting material, a matrix or an optical isomerization material to perform the function of the nonlinear optical material.

The optical recording medium of the present invention can be prepared by obtaining a solution by, for example, mixing a material whose optical characteristics can be changed by the electric field, a charge generating material, and a charge transporting material, followed by evaporating the solvent of the solution. The solvent used for preparing the solution noted above includes, for example, trichloroethane, toluene and THF. Alternatively, the optical recording medium of the present invention can be prepared without using a solvent. For example, fine particles are mixed under the heated state of the molecular mixture, followed by rapidly cooling the mixture so as to prepare the optical recording medium of the present invention.

Where a solution is used for preparing the optical recording medium of the present invention, it is possible to dissolve the nonlinear optical molecules in the solution. Where the components such as the charge generating material are not provided by polymers, it is possible to dissolve further a polymer as a matrix. The polymer that is to be dissolved includes, for example, a polyethylene resin, a nylon resin, a polyester resin, a polycarbonate resin, a polyarylene resin, a butyral resin, a polystyrene resin and a styrene-butadiene copolymer resin. These polymers can be used singly or in the form of a mixture of at least two of these polymers.

Figure 6:
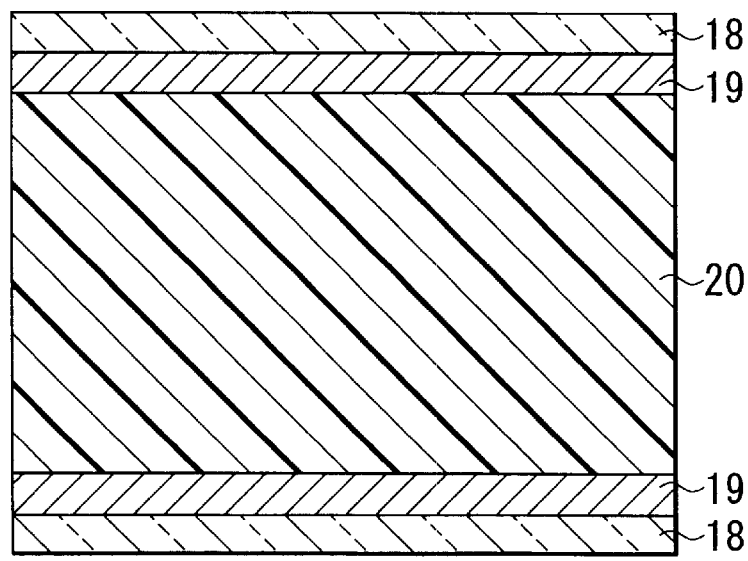
FIG. 6 is a cross sectional view showing an example of the optical recording medium of the present invention.

FIG. 6 is a cross sectional view showing as an example of an optical recording medium of the present invention. As shown in FIG. 6, transparent electrodes 19 are formed on two opposite surfaces of a photorefractive medium 20 in the optical recording medium of the present invention. Further, a transparent substrate 18 is formed on the surface of each of these transparent electrodes 19.

In the optical recording medium of the present invention, information is recorded by allowing two light beams to form an interference pattern. Therefore, it is possible to use a coherent light as the light source. In order to obtain an interference pattern, it is desirable to divide the light of the same light source into form two light beams. Alternatively, it is also possible to use different light sources by mutually applying feedback to two light sources having the same output wavelength, i.e., by supplying the output light to the mating light source. Incidentally, the light used in the present invention includes an ultraviolet light, a visible light, and an electromagnetic wave represented by an infrared rays.

For recording information in the optical recording medium of the present invention, it is possible to employ a holographic recording and a mark recording. In the case of the holographic recording, information is imparted to one of the two light beams, and the interference pattern generated between the light beam having information imparted thereto and the other light beam is recorded in the optical recording medium. Therefore, an optical path difference is generated between the two light beams and, thus, an interference pattern is not generated in the case of the light beam having a short coherent length. Such being the situation, it is desirable to use a laser beam having a coherence length longer than the optical path difference. In general, where application to the terminal of a computer, the video compilation, the memory for a data base, etc. is considered, the optical path difference within the apparatus is not smaller than about 1 cm. It follows that it is desirable to use as the light source a gas laser and a semiconductor laser, particularly, a semiconductor laser having the coherence length prolonged by application of feedback.

In this case, information can be recorded in and reproduced from the optical recording medium of the present invention by using a recording-reproducing apparatus comprising a recording means for recording information by irradiating the optical recording medium with a recording light having a two dimensionally processed information added thereto together with a reference light, and a reproducing means for reproducing the recorded information by detecting the light emitted when the recording medium is irradiated with the reference light alone by a two dimensional detector.

On the other hand, the mark recording is the technology represented by CD or DVD. In the mark recording, information is recorded in units of bits by utilizing the presence or absence of a mark or by utilizing the difference in output from the marks. The optical recording medium of the present invention can also be used for such a mark recording. Specifically, the collected light beam is scanned in or in the vicinity of the optical recording disc so as to record the mark in a three dimensional direction. In the reproducing step, the beam is scanned for reading information from the recorded mark.

In this case, the optical recording medium of the present invention permits performing the optical recording by using an optical recording apparatus in which the collected light beam is scanned within or in the vicinity of the optical recording disc so as to record the mark three dimensionally. Also, in reproducing the information thus recorded, it is possible to use an optical recording-reproducing apparatus in which the information is read from the recorded mark by scanning the beam.

To be more specific, information can be recorded in the optical recording medium of the present invention by using an optical recording-reproducing apparatus comprising a recording means for recording information by collecting the writing light so as to form marks in the optical recording medium and a reproducing means for reproducing the recorded information by utilizing the phenomenon that the reflectance or the refractive index of light differs depending on the presence or absence of the mark when the medium is irradiated with the reproduced light.

In the optical recording medium of the present invention, the average intermolecular distance of the noticed charge transporting material is set to fall within a predetermined range, making it possible to set the ratio $D/\mu$ at a sufficiently large value. As a result, a large internal electric field is formed upon light irradiation even under the condition that the electric field applied from the outside is very low, e.g., not higher than 1,000V. This is advantageous in that it is unnecessary to mount a high voltage power source to the optical recording-reproducing apparatus. In some cases, an internal electric field can be formed without applying an electric field from the outside in the optical recording medium of the present invention. It follows that the present invention provides an optical recording medium having a high diffraction efficiency and excellent in the preservation stability of the recorded information.

The present invention will now be described more in detail with reference to Examples and Comparative Examples which follow. Needless to say, however, the technical scope of the present invention is not limited by these Examples.

EXAMPLE 1

A toluene solution was prepared by dispersing and dissolving the components given below in toluene:

Nonlinear Optical Material and Charge Generating Material:

Carbon cluster $C_{60}$ . . . 0.3% by weight

Charge transporting material:

(C-1) . . . 33.2% by weight

Matrix:

polystyrene . . . 66.5% by weight

The chemical formula of compound C-1 used as the charge transporting material is as follows:

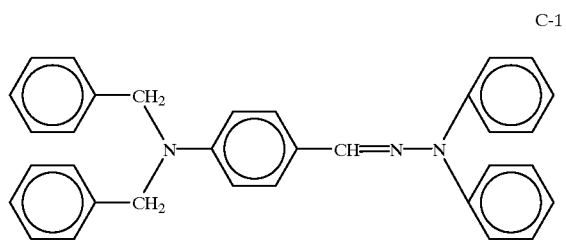

C-1

Compound (C-1) used as the charge transporting material exhibits the mobility given below, when the compound is mixed with polycarbonate to have an intermolecular distance of 1.2 nm:

$4.1 \times 10^{-7}$ ($cm^2/V/s$), electric field of $2.5 \times 10^5$ (V/cm), temperature of 273K The toluene solution thus prepared was heated under a reduced pressure so as to remove the solvent and, thus, to obtain a dry substance. On the other hand, a quartz substrate was heated in advance to 120° C., and a spacer for controlling the film thickness and the dry substance noted above were disposed on the heated quartz substrate so as to be melted. Further, another quartz substrate was pressed from above against the molten material so as to obtain a sample having a thickness of 150 μm.

Compound C-1 mixed as a charge transporting material was found to have a permanent dipole moment p1 of 2.71 (debye), and the specific gravity $\rho_a$ of the medium was found to be 1.12. Since the average intermolecular distance a calculated from the permanent dipole moment of compound C-1 and the specific gravity of the medium is 1.30 nm, the relationships represented by formulas (1) and (2) given previously are satisfied. Also, since $a_v=0.967$, b is set equal to a ($b=a_v$) in accordance with formula (6), and formula (6) was calculated with the relative dielectric constant $\epsilon_r$ set at 3.0 ($\epsilon_r=3.0$). As a result, $a_{max}$ at which this value forms a maximal value was found to be 1.1 nm. It follows that the value of the average intermolecular distance a falls within the range of $a_{max}-0.1<a<a_{max}+0.3$, and the relationship of formula (3) is also satisfied.

Then, the diffraction efficiency of the grating due to the change in the optical characteristics based on the electric field formed within the film by the light irradiation was measured so as to evaluate the performance of the sample as an optical recording medium.

Figure 4:
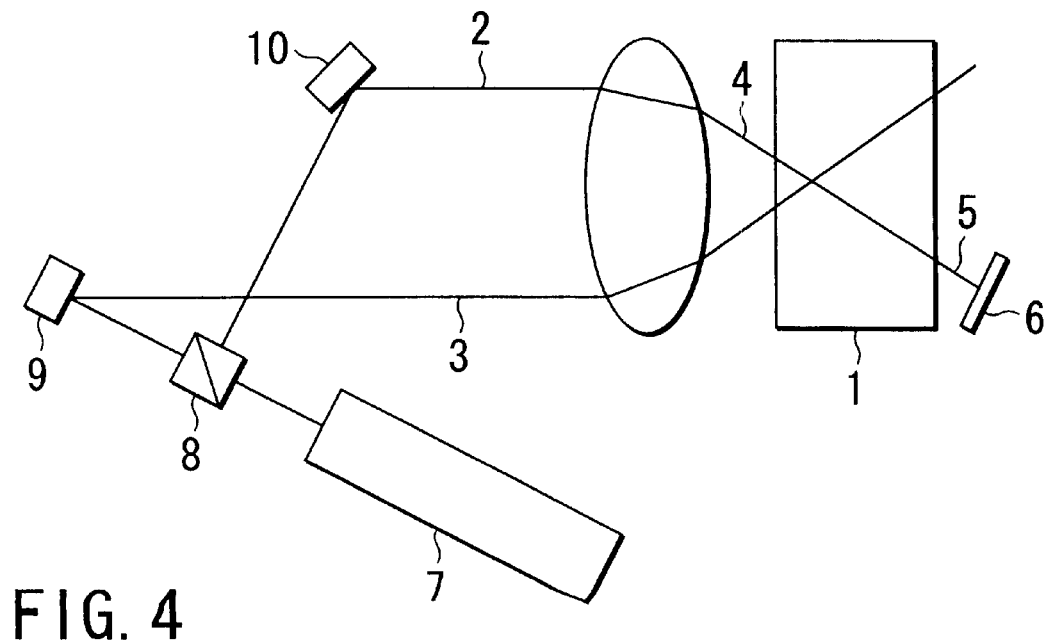
FIG. 4 is a schematic drawing for explaining an example of the write-read principle using an optical recording medium of the present invention.

FIG. 4 schematically shows the write-read principle using the optical recording medium of the present invention.

As shown in the drawing, a helium-neon laser beam emitted from a laser light source 7 is split by a beam splitter 8 into an object light beam 2 and a reference light beam 3. These two light beams pass through mirrors 9 and 10, respectively, so as to intersect on a sample 1, with the result that an interference pattern is formed on the sample 1 by these two laser beams. An internal electric field is generated by the interference pattern thus generated so as to bring about modulation of the optical characteristics and, thus, to form a grating in the medium. Where sample 1 is utilized as an optical recording medium, the sample is irradiated with light reflected from the object recording the object light. It is possible to use light transmitted through a transparent image display element (space modulator). Further, the reference light was emitted to intersect the light described above and to cover the irradiating surface. The information writing was performed by leaving the situation as it was for 10 seconds.

Then, the object light was intercepted, and the recorded information was reproduced by irradiating sample 1 with the reference light 3 alone as in the writing step. If information is written, an internal electric field is generated in accordance with the interference pattern generated by the overlapping between the object light and the reference light so as to change the optical characteristics. In this fashion, a grating is formed in the medium. It follows that the reference light 3 is diffracted by the grating formed in the medium 1 so as to be separated into the component of the reference light 3, component 4 in the reflecting direction of the object light 2, and the component 5 in the transmitting direction of the object light 5.

Such being the situation, if a light detector 6 such as a CCD for taking in the optical power beam for measuring the intensity of the reproduced beam or the reproduced image is arranged in advance in direction 5 in which the object light is transmitted, the object light that must have not been projected, i.e., a reproduced image, can be observed by the light detector 6. In other words, the sample 1 performs the function of an optical memory.

A ratio $I_{obj.}/I_{ref.}$, i.e., the ratio of the intensity $I_{obj.}$ of the object light reproduced by the reference light to the intensity $I_{ref.}$ of the reference light, was obtained as a diffraction efficiency.

The diffraction efficiency of the film of Example 1, which was measured by the procedures described above, was found to be 5.0%, and it was possible to read the recorded information for about 8 months.

COMPARATIVE EXAMPLE 1

A toluene solution was prepared as in Example 1, except that the content of the charge transporting material C-1 was increased to 90% by weight while decreasing the content of polystyrene used as a matrix, and a sample having a thickness of 150 nm was prepared by the procedures equal to those employed in Example 1.

Compound C-1 mixed as a charge transporting material was found to have a permanent dipole moment p1 of 2.71 (debye), and the specific gravity $\rho_a$ of the medium was found to be 1.075. Since the average intermolecular distance a calculated from the permanent dipole moment of compound C-1 and the specific gravity of the medium is 0.97 nm, the relationships represented by formulas (1) and (2) given previously are satisfied. Also, since $a_v$=0.967, b is set equal to a ($b=a_v$) in accordance with formula (6), and formula (4) was calculated with the relative dielectric constant $\epsilon_r$ set at 3.0 ($\epsilon_r$=3.0). As a result, $a_{max}$ at which this value forms a maximal value was found to be 1.1 nm. It follows that the value of the average intermolecular distance a fails to fall within the range of $a_{max}$-0.1<a<$a_{max}$+0.3, and the relationship of formula (3) is not satisfied.

The characteristics of the sample thus obtained were evaluated as in Example 1. The photorefractive effect was certainly found to have been produced. However, the refractive efficiency was only 0.002%, which was extremely lower than that in Example 1. Also, it was impossible to read the information recorded in the sample about 3 hours later.

EXAMPLE 2

A toluene solution was prepared by dispersing and dissolving the components given below in toluene:

Nonlinear Optical Material:

N-1 . . . 0.3% by weight

Charge generating material:

carbon cluster $C_{70}$ . . . 0.4% by weight

Charge transporting material:

(C-2) . . . 0.2% by weight (C-3) . . . 15.0% by weight

Matrix: polystyrene . . . 64.4% by weight

The chemical formulas of compounds N-1, C-2 and C-3 used are as follows:

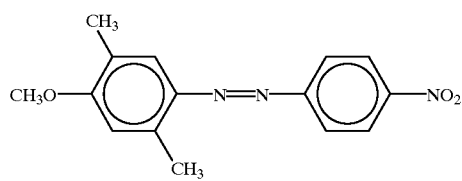

N-1

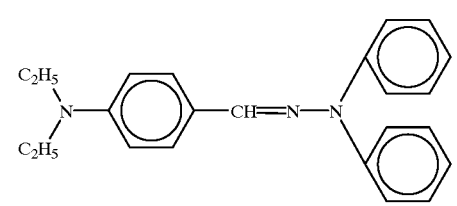

C-2

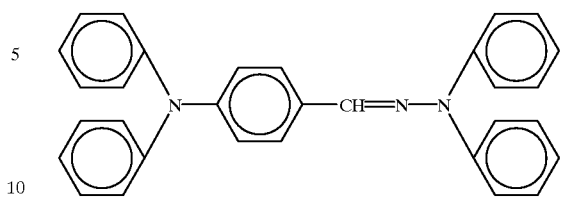

C-3

Compounds (C-2) and (C-3) used as the charge transporting material exhibit the mobility given below, when each of these compounds is mixed with polycarbonate to have an intermolecular distance of 1.2 nm:

C-2: $3.7 \times 10^{-7}$ ($cm^2$/V/s), electric field of $2.5 \times 10^5$ (V/cm), temperature of 273K C-3: $1.3 \times 10^{-6}$ ($cm^2$/V/s), electric field of $2.5 \times 10^5$ (V/cm), temperature of 273K Fine particles prepared in advance were added to the toluene solution thus prepared in a volume fraction of 0.7 relative to the solid components. Then, the resultant toluene solution was heated under a reduced pressure so as to remove the solvent and, thus, to obtain a dry substance. On the other hand, a quartz substrate was heated in advance to 120° C., and a spacer for controlling the film thickness and the dry substance noted above were disposed on the heated quartz substrate so as to be melted. Further, another quartz substrate was pressed from above against the molten material so as to obtain a sample having a thickness of 1 mm.

The absorption spectrum of the sample thus prepared was observed. The compound C-2 used as a charge transporting material and the carbon cluster $C_{70}$ used as the charge generating material were found to have formed a charge transporting complex. Since compound C-3 has a higher mobility and a higher content, compared with compound C-2, compound C-3 constitutes the first charge transporting material with compound C-2 constituting the second charge transporting material.

Compound C-3 constituting the first charge transporting material was found to have a permanent dipole moment pi of 1.79 (debye), and the specific gravity $\rho_a$ of the medium was found to be 1.14. Also, compound C-2 constituting the second charge transporting material was found to have a permanent dipole moment p2 of 3.13 (debye). The average intermolecular distance a of the first charge transporting material, which was calculated from the permanent dipole moment of compound C-3 and the specific gravity of the medium, is 0.97 nm. On the other hand, the average intermolecular distance d of the second charge transporting material, which was calculated from the permanent dipole moment of compound C-2 and the specific gravity of the medium, is 5.56 nm. The average intermolecular distance d of the second charge transporting material can be calculated using the same formula as calculating a. It follows that the relationships represented by formulas (1) and (2) given previously are satisfied. Also, since $a_v$=0.86, b is set equal to a ($b=a_v$) in accordance with formula (6), and formula (7) was calculated with the relative dielectric constant $\epsilon_r$ set at 2.8 ($\epsilon_r$=2.8). As a result, $a_{max}$ at which this value forms a maximal value was found to be 1.1 nm. It follows that the value of the average intermolecular distance a falls within the range of $a_{max}$-0.1<a<$a_{max}$+0.3, and the relationship of formula (3) is also satisfied.

Then, a pit-like change was formed within the film by collecting the recording light so as to evaluate the performance of the resultant sample as an optical recording medium.

Figure 5:
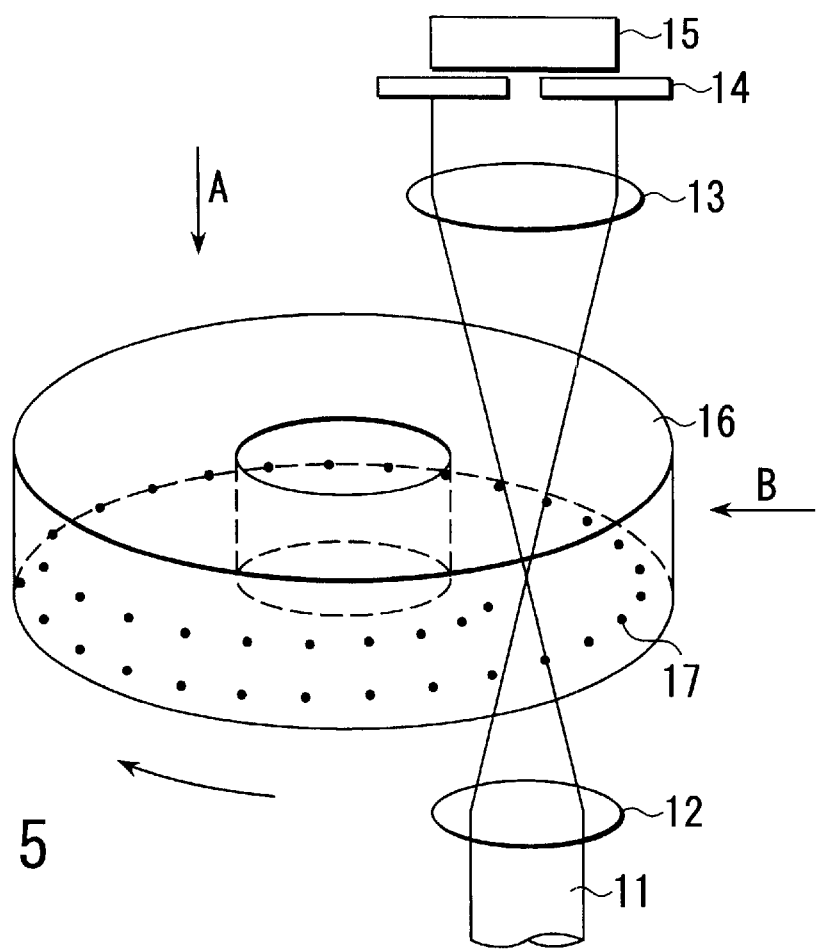
FIG. 5 is a schematic drawing for explaining another example of the write-read principle using an optical recording medium of the present invention.

FIG. 5 schematically shows the write-read principle using the optical recording medium of the present invention.

As shown in the drawing, an optical recording disc 16 is set movable relative to the recording light in a radial direction B, too. In other words, the optical recording disc 16 is movable in the radial direction B relative to the recording light while making rotations.

In recording information, a lens 12 was fixed, and the optical recording disc 16 was moved in the radial direction while rotating the optical recording disc 16. As a result, a layer in which recording marks (pits) were arranged to form a planar configuration was formed in the optical recording disc 16. Then, the lens 12 was moved upward while rotating the optical recording disc 16, with the result that a light beam 11 was spirally scanned as in the recording step so as to form in the optical recording disc 16 a portion in which the recording marks were spirally arranged. In this case, a pulse wave turned on and off by, for example, a shutter was used as the light beam 11.

The operation described above was repeated so as to form an arrangement of the recording marks (pits) in the optical recording disc 16. Formed in the optical recording disc 16 after the recording operation were 80 layers each having the recording marks spirally arranged therein. The recording marks were also arranged spirally in the space between adjacent layers of the recording marks. The arrangement of the recording marks is schematically shown in FIG. 5.

Further, the recorded information was reproduced by using an apparatus similar to that described previously. Specifically, the light beam 11 for reproduction was scanned along the optical recording medium 16 as in the recording step by using a semiconductor laser having a wavelength of 680 nm as a light source so as to permit a photo detector 15 to detect the light transmitted through the optical recording disc 16 as a reproducing light. In this case, feedback was applied to the lens moving mechanism in accordance with the magnitude of the change in the intensity of the reproducing light so as to correct the vertical movement of the lens 12 for collecting the light beam 11, thereby providing the condition under which the presence or absence of the mark can be discriminated.

It has been found that the optical recording disc for Example 2 was capable of achieving a recording density of $10^{10}$ bits/cm$^3$. In addition, the recorded information can be read at 5 bps.

COMPARATIVE EXAMPLE 2

A sample having a thickness of 1 mm was prepared as in Example 2, except that compound C-3 was added in place of polystyrene. Since the content of compound C-3 is higher than that of compound C-2, compound C-3 constitutes the first charge transporting material, with compound C-2 constituting the second charge transporting material.

Compound C-3 constituting the first charge transporting material was found to have a permanent dipole moment p1 of 1.79 (debye), and the specific gravity $\rho_a$ of the medium was found to be 1.30. Also, compound C-2 constituting the second charge transporting material was found to have a permanent dipole moment p2 of 3.13 (debye). The average intermolecular distance a of the first charge transporting material, which was calculated from the permanent dipole moment of compound C-3 and the specific gravity of the medium, is 0.90 nm. On the other hand, the average intermolecular distance d of the second charge transporting material, which was calculated from the permanent dipole moment of compound C-2 and the specific gravity of the medium, is 5.33 nm. It follows that the relationships represented by formulas (1) and (2) given previously are satisfied. Also, since $a_v$=0.82, b is set equal to a (b=$a_v$) in accordance with formula (6), and formula (7) was calculated with the relative dielectric constant $\epsilon_r$ set at 2.8 ($\epsilon_r$=2.8). As a result, $a_{max}$ at which this value forms a maximal value was found to be 1.1 nm. It follows that the value of the average intermolecular distance a fails to fall within the range of $a_{max}$−0.1<a<$a_{max}$+0.3, and the relationship of formula (3) is not satisfied.

The characteristics of the obtained sample were measured as in Example 2. However, the photorefractive effect was not found to have been produced.

EXAMPLE 3

A tetrahydrofuran solution was prepared by dissolving the components given below in tetrahydrofuran:

Charge generating and charge transporting polymer:
polyvinyl carbazole . . . 20.0% by weight
Charge generating material: trinitrofluorenone . . . 1.0% by weight
Nonlinear Optical Material:
N-[[4-(diethylamino)phenyl]methylene]2-methyl-4-nitro-benzenamine (DBMNA) . . . 79.0% by weight Polyvinyl carbazole used as the charge transporting material exhibits the mobility given below:

2.5×10$^{-7}$ (cm$^2$/V/s), electric field of 2.5×10$^5$ (V/cm), temperature of 273K The solution thus obtained was heated at 30° C. for 2 hours under a nitrogen gas atmosphere, followed by further heating the solution at 50° C. for 24 hours so as to remove the solvent. Then, the solidified material was sandwiched between glass substrates each having a transparent electrode formed thereon, and these glass substrates were subjected to contact bonding under heat with a spacer interposed therebetween so as to prepare a sample.

Polyvinyl carbazole mixed as a charge transporting material was found to have a permanent dipole moment p1 of 1.85 (debye), and the specific gravity $\rho_a$ of the medium was found to be 1.30. Since the average intermolecular distance a calculated from the permanent dipole moment of polyvinyl carbazole and the specific gravity of the medium is 1.09 nm, the relationships represented by formulas (1) and (2) given previously are satisfied. Also, since $a_v$=0.64, b is set equal to a (b=$a_v$) in accordance with formula (6), and formula (4) was calculated with the relative dielectric constant $\epsilon_r$ set at 3.5 ($\epsilon_r$=3.5). As a result, $a_{max}$ at which this value forms a maximal value was found to be 0.94 nm. It follows that the value of the average intermolecular distance a falls within the range of $a_{max}$−0.1<a<$a_{max}$+0.3, and the relationship of formula (3) is also satisfied.

Then, the diffraction efficiency of the grating due to the change in the optical characteristics based on the electric field formed within the film by the light irradiation was measured so as to evaluate the performance of the sample as an optical recording medium. In this Example, the diffraction efficiency was measured as in Example 1, except that Kr$^+$ laser was used as the laser light source and a voltage of 500V was applied to the sample.

As a result, it was found possible to reproduce the information recorded in the optical recording medium for this Example by using an image evaluation apparatus, i.e., a space light modulator. The diffraction efficiency in this case was found to be 1.0%, supporting that the sample exhibits a sufficient performance as a recording medium. In addition, it was possible to read the recorded information for about 8 months.

COMPARATIVE EXAMPLE 3

A tetrahydrofuran solution was prepared by dissolving the components given below in tetrahydrofuran:

Charge generating and charge transporting polymer: polyvinyl carbazole . . . 59.0% by weight Charge generating material: trinitrofluorenone . . . 1.0% by weight Nonlinear Optical Material: N-[[4-(diethylamino) phenyl] methylene]2-methyl-4-nitro-benzenamine (DBMNA) . . . 40.0% by weight Polyvinyl carbazole used as the charge transporting material exhibits the mobility given below:

$2.7 \times 10^{-6}$ ($cm^2/V/s$), electric field of $2.5 \times 10^5$ (V/cm), temperature of 273K The solution thus obtained was heated at 30° C. for 2 hours under a nitrogen gas atmosphere, followed by further heating the solution at 50° C. for 24 hours so as to remove the solvent. Then, the solidified material was sandwiched between glass substrates each having a transparent electrode formed thereon, and these glass substrates were subjected to contact bonding under heat with a spacer interposed therebetween so as to prepare a sample.

Polyvinyl carbazole mixed as a charge transporting material was found to have a permanent dipole moment p1 of 1.85 (debye), and the specific gravity $\rho_a$ of the medium was found to be 1.30. Since the average intermolecular distance a calculated from the permanent dipole moment of polyvinyl carbazole and the specific gravity of the medium is 0.75 nm, the relationships represented by formulas (1) and (2) given previously are satisfied. Also, since $a_v=0.64$, b is set equal to a ($b=a_v$) in accordance with formula (6), and formula (4) was calculated with the relative dielectric constant $\epsilon_r$ set at 3.5 ($\epsilon_r=3.5$). As a result, $a_{max}$ at which this value forms a maximal value was found to be 0.94 nm. It follows that the value of the average intermolecular distance a fails to fall within the range of $a_{max}-0.1<a<a_{max}+0.3$, and the relationship of formula (3) is not satisfied.

The characteristics of the sample thus obtained were evaluated as in Example 3. It was certainly possible to record information in the medium by using an image evaluating apparatus, i.e., a space light modulator. However, the recording required time about three times as much as that for Example 3. Also, the diffraction efficiency was found to be low, i.e., 0.02%, and the holding time was also found to be short, i.e., about 36 hours. It follows that the sample failed to exhibit a sufficient performance as a recording medium.

EXAMPLE 4

A tetrahydrofuran solution was prepared by dissolving the components given below in tetrahydrofuran:

Charge transporting material:

N,N-diphenyl-N,N'-di(m-toyl)-p-benzidine . . . 80.0% by weight

Charge generating material: trinitrofluorenone . . . 0.5% by weight

Nonlinear Optical Material:

N-[[4-(diethylamino)phenyl]methylene]2-methyl-4-nitro-benzeneamine (DBMNA) . . . 19.5% by weight The compound used as the charge transporting material exhibits the mobility given below, when the compound is mixed with polycarbonate to have an intermolecular distance of 1.2 nm:

$5.6 \times 10^{-6}$ ($cm^2/V/s$), electric field of $2.5 \times 10^5$ (V/cm), temperature of 273K The solution thus obtained was heated at 30° C. for 2 hours under a nitrogen gas atmosphere, followed by further heating the solution at 50° C. for 24 hours so as to remove the solvent. Then, the solidified material was sandwiched between glass substrates each having a transparent electrode formed thereon, and these glass substrates were subjected to contact bonding under heat with a spacer interposed therebetween so as to prepare a sample.

N,N-diphenyl-N,N'-di(m-toyl)-p-benzidine mixed as a charge transporting material was found to have a permanent dipole moment p1 of 1.52 (debye), and the specific gravity $\rho_a$ of the medium was found to be 1.05. Since the average intermolecular distance a calculated from the permanent dipole moment of N,N-diphenyl-N,N'-di(m-toyl)-p-benzidine and the specific gravity of the medium is 1.02 nm, the relationships represented by formulas (1) and (2) given previously are satisfied. Also, since $a_v=0.95$, b is set equal to a ($b=a_v$) in accordance with formula (6), and formula (4) was calculated with the relative dielectric constant $\epsilon_r$ set at 2.8 ($\epsilon_r=2.8$). As a result, $a_{max}$ at which this value forms a maximal value was found to be 0.95 nm. It follows that the value of the average intermolecular distance a falls within the range of $a_{max}-0.1<a<a_{max}+0.3$, and the relationship of formula (3) is also satisfied.

Then, the diffraction efficiency of the grating due to the change in the optical characteristics based on the electric field formed within the film by the light irradiation was measured so as to evaluate the performance of the sample as an optical recording medium. In this Example, the diffraction efficiency was measured as in Example 1, except that $Kr^+$ laser was used as the laser light source and a voltage of 500V was applied to the sample.

As a result, it was found possible to reproduce the information recorded in the optical recording medium for this Example by using an image evaluation apparatus, i.e., a space light modulator. The diffraction efficiency in this case was found to be 2%, supporting that the sample exhibits a sufficient performance as a recording medium. In addition, it was possible to read the recorded information for about 8 months.

COMPARATIVE EXAMPLE 4

A tetrahydrofuran solution was prepared by dissolving the components given below in tetrahydrofuran:

Charge Transporting Material:

N,N-diphenyl-N,N'-di(m-toyl)-p-benzidine . . . 95.0% by weight

Charge Generating Material:

$C_{70}$ . . . 0.3% by weight

Nonlinear Optical Material:

N-[[4-(diethylamino)phenyl]methylene]2-methyl-4-nitro-benzenamine (DBMNA) . . . 4.7% by weight The solution thus obtained was heated at 30° C. for 2 hours under a nitrogen gas atmosphere, followed by further heating the solution at 50° C. for 24 hours so as to remove the solvent. Then, the solidified material was sandwiched between glass substrates each having a transparent electrode formed thereon, and these glass substrates were subjected to contact bonding under heat with a spacer interposed therebetween so as to prepare a sample.

N,N-diphenyl-N,N'-di(m-toyl)-p-benzidine mixed as a charge transporting material was found to have a permanent dipole moment p1 of 1.52 (debye), and the specific gravity $\rho_a$ of the medium was found to be 1.30. Since the average intermolecular distance a calculated from the permanent dipole moment of N,N-diphenyl-N,N'-di(m-toyl)-p-benzidine and the specific gravity of the medium is 0.65 nm, the relationships represented by formulas (1) and (2) given previously are satisfied. Also, since $a_v$=0.64, b is set equal to a (b=$a_v$) in accordance with formula (6), and formula (4) was calculated with the relative dielectric constant $\epsilon_r$ set at 2.8 ($\epsilon_r$=2.8). As a result, $a_{max}$ at which this value forms a maximal value was found to be 0.95 nm. It follows that the value of the average intermolecular distance a fails to fall within the range of $a_{max}$−0.1<a<$a_{max}$+0.3, and the relationship of formula (3) is not satisfied.

The characteristics of the sample thus obtained were evaluated as in Example 1. It was certainly possible to record information in the medium by using an image evaluating apparatus, i.e., a space light modulator. However, the recording required time about three times as much as that for Example 4. Also, the diffraction efficiency was found to be low, i.e., 0.01%, and the holding time was also found to be short, i.e., about 60 hours. It follows that the sample failed to exhibit a sufficient performance as a recording medium.

EXAMPLE 5

A toluene solution was prepared by dissolving the components given below in toluene:

Nonlinear Optical Material: Cyano Isobutyl Acetic Acid Ester: . . . 35.0% by weight Charge Generating Material:

$C_{70}$ . . . 0.8% by weight

Charge Transporting Material:

1,1-bis(di-4-tolylaminophenyl)cyclohexane (TAPC) . . . 49.2% by weight

N,N'-diphenyl-N,N'-bis(3-methylphenyl)-(1,1'-biphenyl)-4,4'-diamine (TPD) . . . 10.0% by weight Polyvinyl carbazole . . . 5.0% by weight The charge transporting material used exhibits the mobility given below, when the material is mixed with polycarbonate to have an intermolecular distance of 1.2 nm:

TAPC: $7.0 \times 10^{-6}$ (cm$^2$/V/s), electric field of $2.5 \times 10^5$ (V/cm), temperature of 273K TPD: $2.5 \times 10^{-7}$ (cm$^2$/V/s), electric field of $2.5 \times 10^5$ (V/cm), temperature of 273K Also, polyvinyl carbazole used as the charge transporting polymer exhibits the mobility given below:

$2.7 \times 10^{-6}$ (cm$^2$/V/s), electric field of $2.5 \times 10^5$ (V/cm), temperature of 273K A sample was obtained by preparing a film having a thickness of 200 μm as in Example 1, except that used was the toluene solution thus prepared.

The permanent dipole moment of TAPC providing the first charge transporting material was found to be 1.41 (debye). Also, TPD and polyvinyl carbazole used as the second and third charge transporting materials were found to exhibit the permanent dipole moment of 1.52 (debye) and 1.85 (debye), respectively. These values satisfy the relationship given by formula (2).

The specific gravity $\rho_a$ of the medium was found to be 1.15. Therefore, the average intermolecular distance "a" of TAPC providing the first charge transporting material is 1.22 nm and, thus, the relationship given by formula (1) is satisfied. Also, concerning the size of the TAPC molecule, b is equal to a (b=$a_v$) in accordance with formula (6) because $a_v$ is equal to 0.95 nm ($a_v$=0.95 nm). The average intermolecular distance of TPD is 1.94 nm, and polyvinyl carbazole has the average intermolecular distance of 1.77 nm. Formula (8) was calculated with the relative dielectric constant $\epsilon_r$ set at 3.2 ($\epsilon_r$=3.2). As a result, $a_{max}$ at which this value forms a maximal value was found to be 0.93 nm. It follows that the value of the average intermolecular distance a falls within the range of $a_{max}$−0.1<a<$a_{max}$+0.3, and, thus, the relationship of formula (3) is also satisfied.

The characteristics of the sample obtained were evaluated as in Example 1. The diffraction efficiency was found to reach about 8.0%, and it was possible to read the recorded information for 3 years or more.

COMPARATIVE EXAMPLE 5

A toluene solution was prepared by dispersing and dissolving the components given below in toluene:

Nonlinear Optical Material: Cyano Isobutyl Acetic Acid Ester: . . . 35.0% by weight Charge Generating Material:

$C_{70}$ . . . 0.8% by weight

Charge Transporting Material:

1,1-bis(di-4-tolylaminophenyl)cyclohexane (TAPC) . . . 35.2% by weight

N,N'-diphenyl-N,N'-bis(3-methylphenyl)-(1,1'-biphenyl)-4,4'-diamine (TPD) . . . 24.0% by weight Polyvinyl carbazole . . . 5.0% by weight The charge transporting molecules used exhibit the mobility given below, when the molecules are mixed with polycarbonate to have an intermolecular distance of 1.2 nm:

TAPC: $7.0 \times 10^{-6}$ (cm$^2$/V/s), electric field of $2.5 \times 10^5$ (V/cm), temperature of 273K TPD: $2.5 \times 10^{-7}$ (cm$^2$/V/s), electric field of $2.5 \times 10^5$ (V/cm), temperature of 273K Also, polyvinyl carbazole used as the charge transporting polymer exhibits the mobility given below:

$2.7 \times 10^{-6}$ (cm$^2$/V/s), electric field of $2.5 \times 10^5$ (V/cm), temperature of 273K A sample was obtained by preparing a film having a thickness of 200 μm as in Example 1, except that used was the toluene solution thus prepared.

The permanent dipole moment of TAPC providing the first charge transporting material was found to be 1.41 (debye). Also, TPD and polyvinyl carbazole used as the second and third charge transporting materials were found to exhibit the permanent dipole moment of 1.52 (debye) and 1.85 (debye), respectively. These values satisfy the relationship given by formula (2).

The specific gravity Pa of the medium was found to be 1.15. Therefore, the average intermolecular distance "a" of TAPC providing the first charge transporting material is 1.37 nm and, thus, the relationship given by formula (1) is satisfied. Also, concerning the size of the TAPC molecule, $a_v$ is equal to 0.95 nm ($a_v$=0.95 nm) and, thus, b=$a_v$ in accordance with formula (6). The average intermolecular distance of TPD is 1.45 nm, and polyvinyl carbazole has the average intermolecular distance of 1.77 nm. Formula (8) was calculated with the relative dielectric constant $\epsilon_r$ set at 3.2 ($\epsilon_r$=3.2). As a result, $a_{max}$ at which this value forms a maximal value was found to be 0.92 nm. It follows that the value of the average intermolecular distance a fails to fall within the range of $a_{max}$−0.1<a<$a_{max}$+0.3, and, thus, the relationship of formula (3) is not satisfied.

The characteristics of the sample obtained were evaluated as in Example 1. The initial diffraction efficiency was found to about 2.0%. However, the recorded information was erased in about one week.

As described above, the present invention provides an optical recording medium capable of recording information at a high density by light irradiation under the condition that the electric field applied from the outside is low.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical recording medium having a charge generating ability capable of generating electric charges with different polarities upon irradiation with light and a charge transporting ability capable of transporting at least one of said electric charges to separate specially said electric charges from each other forming an electric field upon irradiation with light, the optical characteristics of said optical recording medium being changed depending on the electric field and the capability of transporting at least one of said electric charges being imparted by a single kind of a charge transporting material, wherein a light intensity pattern is recorded in said optical recording medium depending on the change in the optical characteristics caused by the electric field, and said electric field is generated by spatially separating the electric charges of the different polarity by light irradiation, said charge transporting material is formed of a molecule having the charge transporting capability or a polymer containing a monomer unit having the charge transporting capability, and said charge transporting material has an average intermolecular distance a (nm) and a dipole moment p1 (debye) satisfying at room temperature the relationships represented by formulas (1) to (3) given below:

$$a < 2.0 \quad (1)$$

$$1.0 < p1 \quad (2)$$

$$a_{max} - 0.1 < a < a_{max} + 0.3 \quad (3)$$

where a is calculated from the formula: $a = (M/AC\rho_a)^{1/3}$, where M is the molecular weight of the charge transporting material, A is the Avogadro's number, C is the weight ratio of the charge transporting material in the optical recording medium, and $\rho_a$ is the specific gravity of the optical recording medium; and where $a_{max}$ is the value of the intermolecular distance a when the value represented by formula (4) given below is a maximal value:

$$\frac{(a-0.12)^2}{a^6} \exp\left[\frac{0.087 p_1^2}{\varepsilon_r^2 a^2 b^2} - \frac{1}{(a-0.12)^2}\right] \quad (4)$$

where $\varepsilon_r$ is the relative dielectric constant of the optical recording medium, and b is a value determined as follows in accordance with the relationship between $a_v$ and a:

when $0.54a \geq a_v$, $b = 0.54a$ \quad (5)

when $0.54a < a_v$, $b = a_v$ \quad (6)

where $a_v$ is the length of one side when the charge transporting material is regarded as a cube, and is represented by the formula: $a_v = (M/A\rho_m)^{1/3}$, where M is the molecular weight of the charge transporting material, A is the Avogadro's number, and $\rho_m$ is the specific gravity of the charge transporting material.

2. The optical recording medium according to claim 1, wherein said medium contains an organic molecule exhibiting the charge generating capability, said organic molecule being a charge transporting complex.

3. The optical recording medium according to claim 1, wherein the optical characteristics changed by said electric field are selected from the group consisting of a light absorption rate, the fluorescence efficiency, and the refractive index.

4. The optical recording medium according to claim 1, wherein said medium contains a secondary nonlinear optical material having the optical characteristics changed by the electric field.

5. The optical recording medium according to claim 1, wherein the light intensity pattern is recorded in said medium without application of an external electric field.

6. An optical recording medium having a charge generating ability capable of generating electric charges with different polarities upon irradiation with light and a charge transporting ability capable of transporting at least one of said electric charges to separate specially said electric charges from each other forming an electric field upon irradiation with light, the optical characteristics of said optical recording medium being changed depending on the electric field and the capability of transporting at least one of said electric charges being imparted by a first charge transporting material and a second charge transporting material, wherein a light intensity pattern is recorded in said optical recording medium depending on the change in the optical characteristics caused by the electric field, and said electric field is generated by spatially separating the electric charges of the different polarity by light irradiation, said first charge transporting material has a content higher than that of said second charge transporting material, and each of said first and second charge transporting materials is formed of a molecule having the charge transporting capability or a polymer containing a monomer unit having the charge transporting capability, and said first charge transporting material has an average intermolecular distance a (nm) and a dipole moment p1 (debye) satisfying at room temperature the relationships represented by formulas (1) to (3) given below:

$$a < 2.0 \quad (1)$$

$$1.0 < p1 \quad (2)$$

$$a_{max} - 0.1 < a < a_{max} + 0.3 \quad (3)$$

where a is calculated from the formula: $a = (M/AC\rho_a)^{1/3}$, where M is the molecular weight of the first charge transporting material, A is the Avogadro's number, C is the weight ratio of the first charge transporting material in the optical recording medium, and $\rho_a$ is the specific gravity of the optical recording medium; and where $a_{max}$ is the value of the intermolecular distance a when the value represented by formula (7) given below is a maximal value:

$$\frac{(a-0.12)^2}{a^6}\exp\left[-\frac{0.087p_1^2}{\varepsilon_r^2 a^2 b^2}-\frac{0.087p_2^2}{\varepsilon_r^2 d^4}-\frac{1}{(a-0.12)^2}\right] \quad (7)$$

where $\varepsilon_r$ is the relative dielectric constant of the optical recording medium, d (nm) is an average intermolecular distance of the second charge transporting material, p2 (debye) is the dipole moment of the second charge transporting material, and b is a value determined as follows in accordance with the relationship between $a_v$ and a:

when $0.54a \geq a_v$, $b=0.54a$ (5)

when $0.54a < a_v$, $b=a_v$ (6)

where $a_v$ is the length of one side when the first charge transporting material is regarded as a cube, and is represented by the formula: $a_v=(M/A\rho_m)^{1/3}$, where M is the molecular weight of the first charge transporting material, A is the Avogadro's number, and $\rho_m$ is the specific gravity of the first charge transporting material.

7. The optical recording medium according to claim 6, wherein said medium contains an organic molecule exhibiting the charge generating capability, said organic molecule being a charge transporting complex.

8. The optical recording medium according to claim 6, wherein the optical characteristics changed by said electric field are selected from the group consisting of a light absorption rate, the fluorescence efficiency, and the refractive index.

9. The optical recording medium according to claim 6, wherein said medium contains a secondary nonlinear optical material having the optical characteristics changed by the electric field.

10. The optical recording medium according to claim 6, wherein the light intensity pattern is recorded in said medium without application of an external electric field.

11. An optical recording medium having a charge generating ability capable of generating electric charges with different polarities upon irradiation with light and a charge transporting ability capable of transporting at least one of said electric charges to separate specially said electric charges from each other forming an electric field upon irradiation with light, the optical characteristics of said optical recording medium being changed depending on the electric field and the capability of transporting at least one of said electric charges being imparted by at least three kinds of charge transporting materials, wherein a light intensity pattern is recorded in said optical recording medium depending on the change in the optical characteristics caused by the electric field, and said electric field is generated by spatially separating the electric charges of the different polarity by light irradiation, each of said charge transporting materials is formed of a molecule having the charge transporting capability or a polymer containing a monomer unit having the charge transporting capability, and said charge transporting material having the highest content has an average intermolecular distance a (nm) and a dipole moment p1 (debye) satisfying at room temperature the relationships represented by formulas (1) to (3) given below:

$a < 2.0$ (1)

$1.0 < p1$ (2)

$a_{max} - 0.1 < a < a_{max} + 0.3$ (3)

where a is calculated from the formula: $a=(M/AC \rho_a)^{1/3}$, where M is the molecular weight of the charge transporting material having the maximum content, A is the Avogadro's number, C is the weight ratio of the charge transporting material having the highest content in the optical recording medium, and $\rho_a$ is the specific gravity of the optical recording medium; and where $a_{max}$ is the value of the intermolecular distance a when the value represented by formula (8) given below is a maximal value:

$$\frac{(a-0.12)^2}{a^6}\exp\left[-\frac{0.087P_1^2}{\varepsilon_r^2 a^2 b^2}-\sum_{n=2}^{m}\frac{0.087P_n^2}{\varepsilon_r^2 l_n^4}-\frac{1}{(a-0.12)^2}\right] \quad (8)$$

where $\varepsilon_r$ is the relative dielectric constant of the optical recording medium, $l_n$ is an average intermolecular distance (nm) of the n-th kind of the charge transporting material, $p_n$ is the dipole moment (debye) of the n-th kind the charge transporting material, n is an integer of 2 to m, m is an integer of 3 or more, and b is a value determined as follows in accordance with the relationship between $a_v$ and a:

when $0.54a \geq a_v$, $b=0.54a$ (5)

when $0.54a < a_v$, $b=a_v$ (6)

where $a_v$ is the length of one side when the charge transporting material having the highest content is regarded as a cube, and is represented by the formula: $a_v=(M/A\rho_m)^{1/3}$, where M is the molecular weight of the charge transporting material, A is the Avogadro's number, and $\rho_m$ is the specific gravity of the charge transporting material having the highest content.

12. The optical recording medium according to claim 11, wherein said medium contains an organic molecule exhibiting the charge generating capability, said organic molecule being a charge transporting complex.

13. The optical recording medium according to claim 11, wherein the optical characteristics changed by said electric field are selected from the group consisting of a light absorption rate, the fluorescence efficiency, and the refractive index.

14. The optical recording medium according to claim 11, wherein said medium contains a secondary nonlinear optical material having the optical characteristics changed by the electric field.

15. The optical recording medium according to claim 11, wherein the light intensity pattern is recorded in said medium without application of an external electric field.

16. An optical recording medium having a charge generating ability capable of generating electric charges with different polarities upon irradiation with light and a charge transporting ability capable of transporting at least one of said electric charges to separate specially said electric charges from each other forming an electric field upon irradiation with light, the optical characteristics of said optical recording medium being changed depending on the electric field and the capability of transporting at least one of said electric charges being imparted by at least one kind of charge transporting materials, wherein a light intensity pattern is recorded in said optical recording medium depending on the change in the optical characteristics caused by the electric field, and said electric field is generated by spatially separating the electric charges of the different polarity by light irradiation, each of said charge transporting materials is formed of a molecule having the charge transporting capability or a polymer containing a monomer unit having the charge transporting capability, and the optical recording medium satisfies the relationships represented by formulas (1) to (3) given below:

$$a < 2.0 \quad (1)$$

$$1.0 < p1 \quad (2)$$

$$a_{max} - 0.1 < a < a_{max} + 0.3 \quad (3)$$

where a is an average intermolecular distance (nm) of a main charge transporting material of said charge transporting materials, p1 is the dipole moment (debye) of the main charge transporting material, and $a_{max}$ is the value of the intermolecular distance a when the value represented by formula (15) given below is a maximal value:

$$c(a-0.12)^2 \left( \frac{7.529 \times 10^{11}}{\varepsilon_r^2} \sum_n \frac{P_n^2}{a^3 b_n^3 \gamma^{-2}} \right) \times$$

$$\exp\left\{ -\frac{1}{(a-0.12)^2} \right\} \exp\left( -\frac{3 \times 0.0037647}{5kT\varepsilon_r^2} \sum_n \frac{P_n^2}{a^2 b_n^2 \gamma^{-4/3}} \right) \quad (15)$$

where $\varepsilon_r$ is the relative dielectric constant of the optical recording medium, k is the Boltzmann constant, T is the temperature (K), $P_n$ is the dipole moment of a noticed molecule, $\gamma$ is the number of the noticed molecule present in a unit cube in which the single main charge transporting molecule is present, C is a constant, and $b_n$ is a value determined as follows in accordance with the relationship between $a_v$ and $a/((\gamma)^{1/3})$:

when $0.54a/^3\sqrt{\gamma} \geq a_v$, $b_n = 0.54a$ when $0.54a/^3\sqrt{\gamma} < a_v$, $b_n = a_v$ where $a_v$ is the length of one side when the noticed molecule is regarded as a cube, and $a/((\gamma)^{1/3})$ is an average molecular distance of the noticed molecule.

17. The optical recording medium according to claim 16, wherein said medium contains an organic molecule exhibiting the charge generating capability, said organic molecule being a charge transporting complex.

18. The optical recording medium according to claim 16, wherein the optical characteristics changed by said electric field are selected from the group consisting of a light absorption rate, the fluorescence efficiency, and the refractive index.

19. The optical recording medium according to claim 1, wherein said medium contains a secondary nonlinear optical material having the optical characteristics changed by the electric field.

20. The optical recording medium according to claim 16, wherein the light intensity pattern is recorded in said medium without application of an external electric field.

* * * * *